US009812603B2

United States Patent
Hsu

(10) Patent No.: US 9,812,603 B2
(45) Date of Patent: Nov. 7, 2017

(54) PHOTOSENSING DEVICE WITH GRAPHENE

(71) Applicants: Klaus Y. J. Hsu, Hsinchu (TW); WISPRO TECHNOLOGY CONSULTING CORPORATION LIMITED, Kowloon (HK)

(72) Inventor: Klaus Y. J. Hsu, New Taipei (TW)

(73) Assignees: Klaus Y. J. Hsu, Hsinchu (TW); Wispro Technology Consulting Corporation Limited, Kowloon (HK)

( * ) Notice: Subject to any disclaimer, the term of this patent is extended or adjusted under 35 U.S.C. 154(b) by 0 days.

(21) Appl. No.: 14/291,007

(22) Filed: May 30, 2014

(65) Prior Publication Data
US 2015/0349184 A1    Dec. 3, 2015

(51) Int. Cl.
| | | |
|---|---|---|
| H01L 31/10 | (2006.01) | |
| H01L 31/101 | (2006.01) | |
| H01L 27/146 | (2006.01) | |
| H01L 31/109 | (2006.01) | |
| H01L 31/028 | (2006.01) | |
| H01L 31/108 | (2006.01) | |
| H01L 31/09 | (2006.01) | |

(52) U.S. Cl.
CPC ........ H01L 31/109 (2013.01); H01L 27/1461 (2013.01); H01L 27/14612 (2013.01); H01L 27/14643 (2013.01); H01L 31/028 (2013.01); H01L 31/108 (2013.01); *Y02E 10/547* (2013.01)

(58) Field of Classification Search
CPC ......... H01L 31/0201; H01L 31/022425; H01L 31/022466; H01L 2031/0344; H01L 31/04; H01L 31/044–31/0475; H04N 5/335; H04N 5/3745; C01B 31/0438
See application file for complete search history.

(56) References Cited

U.S. PATENT DOCUMENTS

| | | | | |
|---|---|---|---|---|
| 5,624,861 A | * | 4/1997 | Shibuya | H01L 27/1214 438/164 |
| 7,495,206 B2 | * | 2/2009 | Park | H01L 27/14634 250/214.1 |
| 7,999,292 B2 | * | 8/2011 | Hwang | H01L 27/14634 257/222 |

(Continued)

FOREIGN PATENT DOCUMENTS

| | | |
|---|---|---|
| CN | 101082521 A | 12/2007 |
| WO | 2014036002 A1 | 3/2014 |

OTHER PUBLICATIONS

"High-resistivity graphene/silicon-heterostructure waveguide photodetectors," Xiamou Wang et al., Nature Photonics, Sep. 15, 2013.*

(Continued)

*Primary Examiner* — Maliheh Malek
(74) *Attorney, Agent, or Firm* — Steven Reiss

(57) ABSTRACT

A photosensing device with a photovoltage sensing mechanism, a graphene layer and a semiconductor layer. The graphene layer is sandwiched between the semiconductor layer and a substrate. The photovoltage sensing mechanism senses the photovoltage created by light impinging on the graphene-semiconductor heterojunction. The strength of the photovoltage is used to indicate the level of illumination of the impinging light.

15 Claims, 15 Drawing Sheets

(56) References Cited

U.S. PATENT DOCUMENTS

| | | | | |
|---|---|---|---|---|
| 8,044,478 B2* | 10/2011 | Hwang | H01L 27/1463 | 257/222 |
| 8,110,883 B2* | 2/2012 | Ward | G01J 5/02 | 257/428 |
| 8,133,754 B2* | 3/2012 | Kim | H01L 27/14625 | 257/432 |
| 8,581,307 B1* | 11/2013 | Chen | H01L 27/1461 | 257/222 |
| 8,753,917 B2* | 6/2014 | Gambino | H01L 27/14632 | 257/E31.053 |
| 8,772,729 B1* | 7/2014 | Brown | B82Y 30/00 | 250/370.07 |
| 8,916,947 B2* | 12/2014 | Sargent | H01L 27/1461 | 257/184 |
| 9,080,968 B2* | 7/2015 | Inman | H01L 21/31105 | |
| 9,099,424 B1* | 8/2015 | Sekar | H01L 23/3677 | |
| 9,099,526 B2* | 8/2015 | Or-Bach | H01L 21/6835 | |
| 2005/0035381 A1* | 2/2005 | Holm | H01L 27/1463 | 257/290 |
| 2007/0018269 A1* | 1/2007 | Rhodes | H01L 27/14603 | 257/458 |
| 2008/0079102 A1* | 4/2008 | Chen | H01L 27/14692 | 257/431 |
| 2008/0083939 A1* | 4/2008 | Guidash | H01L 27/14634 | 257/292 |
| 2008/0093695 A1* | 4/2008 | Gao | H01L 27/14636 | 257/428 |
| 2009/0079040 A1* | 3/2009 | Schultz | H01L 21/02381 | 257/632 |
| 2010/0002115 A1* | 1/2010 | Liu | H01L 27/14634 | 348/308 |
| 2010/0176280 A1* | 7/2010 | Yokogawa | G02B 5/201 | 250/226 |
| 2011/0042650 A1* | 2/2011 | Avouris | H01L 29/1606 | 257/29 |
| 2011/0111303 A1* | 5/2011 | Kung | H01B 1/18 | 429/231.8 |
| 2011/0133060 A1* | 6/2011 | Yu | H01L 27/1461 | 250/214.1 |
| 2011/0133061 A1* | 6/2011 | Yu | B82Y 15/00 | 250/214.1 |
| 2011/0309462 A1* | 12/2011 | Sargent | H01L 27/1461 | 257/443 |
| 2012/0068157 A1* | 3/2012 | Kub | B82Y 10/00 | 257/15 |
| 2012/0301150 A1* | 11/2012 | Kawahito | H01L 27/14609 | 398/118 |
| 2012/0308468 A1* | 12/2012 | Choi | C01B 31/043 | 423/415.1 |
| 2012/0313205 A1* | 12/2012 | Haddad | H01L 31/02363 | 257/432 |
| 2013/0082241 A1* | 4/2013 | Kub | H01L 27/148 | 257/21 |
| 2013/0084660 A1* | 4/2013 | Lu | H01L 31/1864 | 438/14 |
| 2013/0263918 A1* | 10/2013 | Konstantatos | H01L 31/035218 | 136/252 |
| 2013/0285130 A1* | 10/2013 | Ting | H01L 27/146 | 257/291 |
| 2013/0300992 A1* | 11/2013 | Kozuka | G02F 1/1343 | 349/123 |
| 2014/0030590 A1* | 1/2014 | Wang | H01B 1/04 | 429/211 |
| 2014/0054551 A1* | 2/2014 | Afzali-Ardakani | H01L 29/45 | 257/30 |
| 2014/0091379 A1* | 4/2014 | Tang | H01L 27/14621 | 257/294 |
| 2014/0103411 A1* | 4/2014 | Dai | H01L 27/14609 | 257/292 |
| 2014/0120653 A1* | 5/2014 | Zhao | H01L 31/0232 | 438/70 |
| 2014/0145282 A1* | 5/2014 | Shen | H01L 27/1462 | 257/432 |
| 2014/0145332 A1* | 5/2014 | Ryan | H01L 23/53238 | 257/751 |
| 2014/0147602 A1* | 5/2014 | Rafailovich | C08J 7/00 | 427/558 |
| 2014/0183736 A1* | 7/2014 | Cox | H01L 51/442 | 257/741 |
| 2014/0263945 A1* | 9/2014 | Huang | H01L 51/428 | 250/200 |
| 2014/0284552 A1* | 9/2014 | Kub | H01L 29/66242 | 257/26 |
| 2014/0353787 A1* | 12/2014 | Peng | H01L 27/14627 | 257/432 |
| 2014/0361250 A1* | 12/2014 | de Heer | H01L 29/66431 | 257/27 |
| 2015/0034907 A1* | 2/2015 | Hersam | H01L 29/8611 | 257/26 |
| 2015/0075602 A1* | 3/2015 | Ozyilmaz | H01L 31/022466 | 136/256 |
| 2015/0083206 A1* | 3/2015 | Novoselov | B82Y 30/00 | 136/256 |
| 2015/0097261 A1* | 4/2015 | Harris | H01L 23/53276 | 257/486 |
| 2015/0155340 A1* | 6/2015 | Lim | H01L 27/3232 | 257/40 |
| 2015/0189200 A1* | 7/2015 | Jin | H04N 5/359 | 348/46 |
| 2015/0200316 A1* | 7/2015 | Gruen | H01L 31/035281 | 136/252 |
| 2015/0214303 A1* | 7/2015 | Ruhl | H01L 29/1606 | 257/29 |
| 2015/0243826 A1* | 8/2015 | An | H01L 31/112 | 250/200 |
| 2016/0343513 A1* | 11/2016 | Kinge | H01G 9/209 | |
| 2017/0005328 A1* | 1/2017 | Xie | | |
| 2017/0077429 A1* | 3/2017 | Huang | H01L 51/4213 | |

OTHER PUBLICATIONS

"Properties of Two-Dimensional Silicon grown on Graphene Substrate," R. Zhou et al., Wright State University, Fairborn, OH, USA.*

* cited by examiner

PHOTOSENSING DEVICE WITH GRAPHENE

FIELD

Embodiments of the present disclosure relate to semiconductor devices, and particularly to a photosensing semiconductor device.

BACKGROUND

Most photosensing devices utilize photodiodes to convert light energy into electronic signals. Conventional photodiodes are p-n junctions or PIN structures that produce a photocurrent when light of a certain intensity strikes the photodiodes. The light energy in the form of photons of sufficient energy excites the electrons in the photodiodes to produce electron-hole pairs. The electron moves towards the conduction band from the valence band thereby producing a photocurrent.

Because most photosensing devices use this photocurrent to represent the intensity of light impinging on the photodiodes, the photosensing devices are vulnerable to high light intensity which may saturate the output signal of photosensing devices, and low light intensity which may induce too little photocurrent and reset circuitry is often needed to reset the photodiode. Therefore there is room for improvement in the art.

BRIEF DESCRIPTION OF THE DRAWINGS

Implementations of the present technology will now be described, by way of example only, with reference to the attached figures.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

Figure 1A:
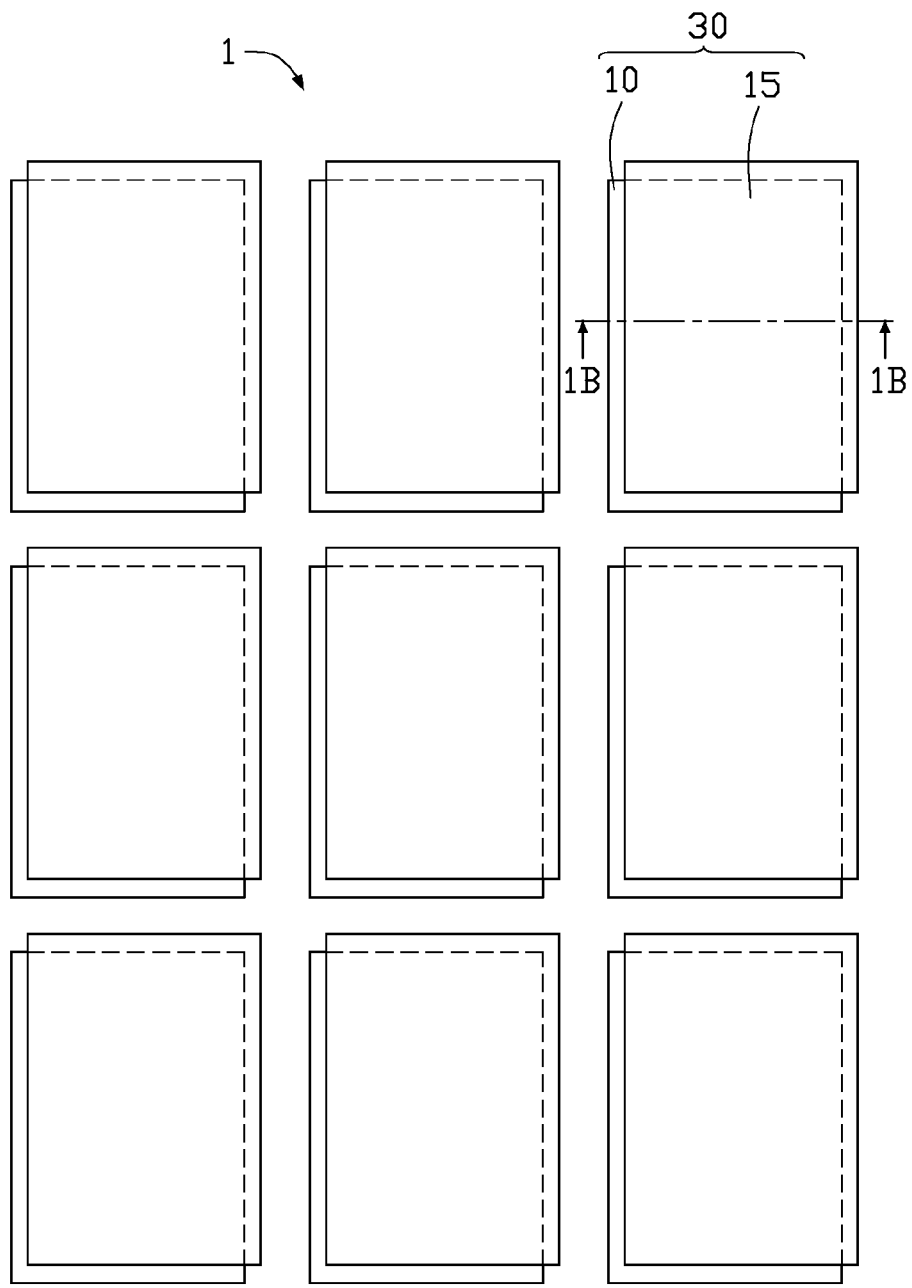
FIG. 1A is a perspective view of an array of photosensing devices having photodiodes in accordance with a first embodiment of the present disclosure.
Figure 1B:
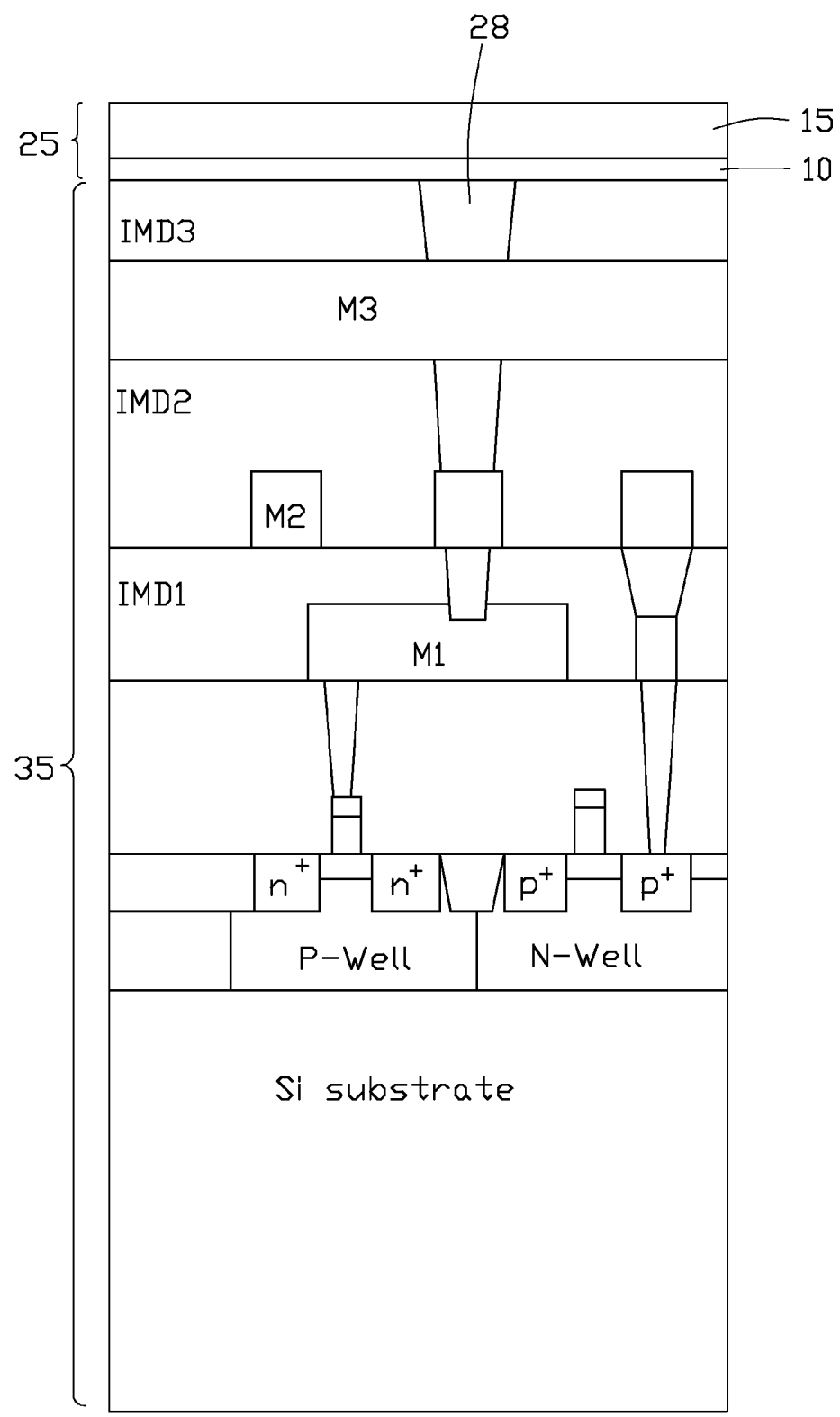
FIG. 1B is a cross-sectional view taken along line 1B-1B in FIG. 1A.
Figure 9:
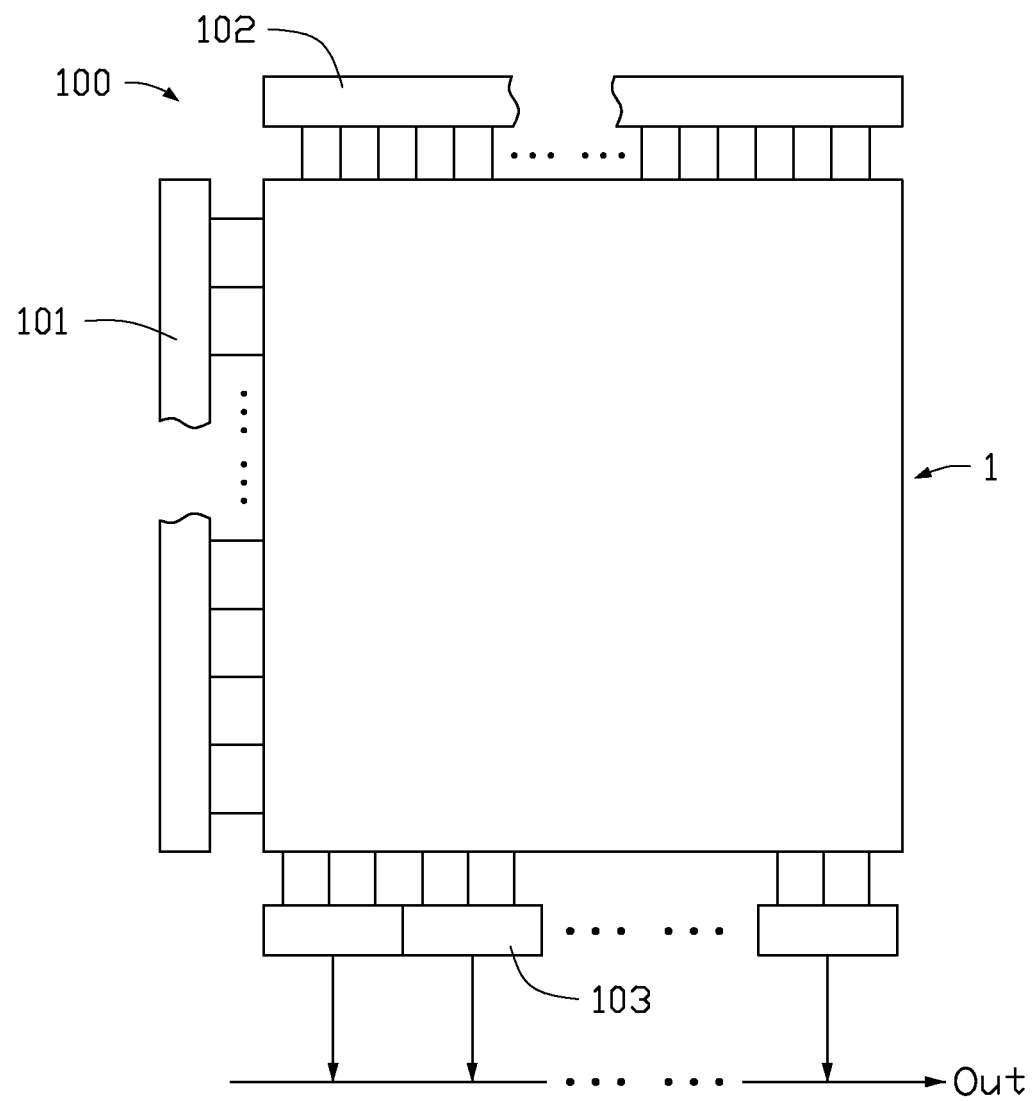
FIG. 9 shows a block diagram of a module using the photosensing device of FIG. 1A or 2A.
Figure 10:
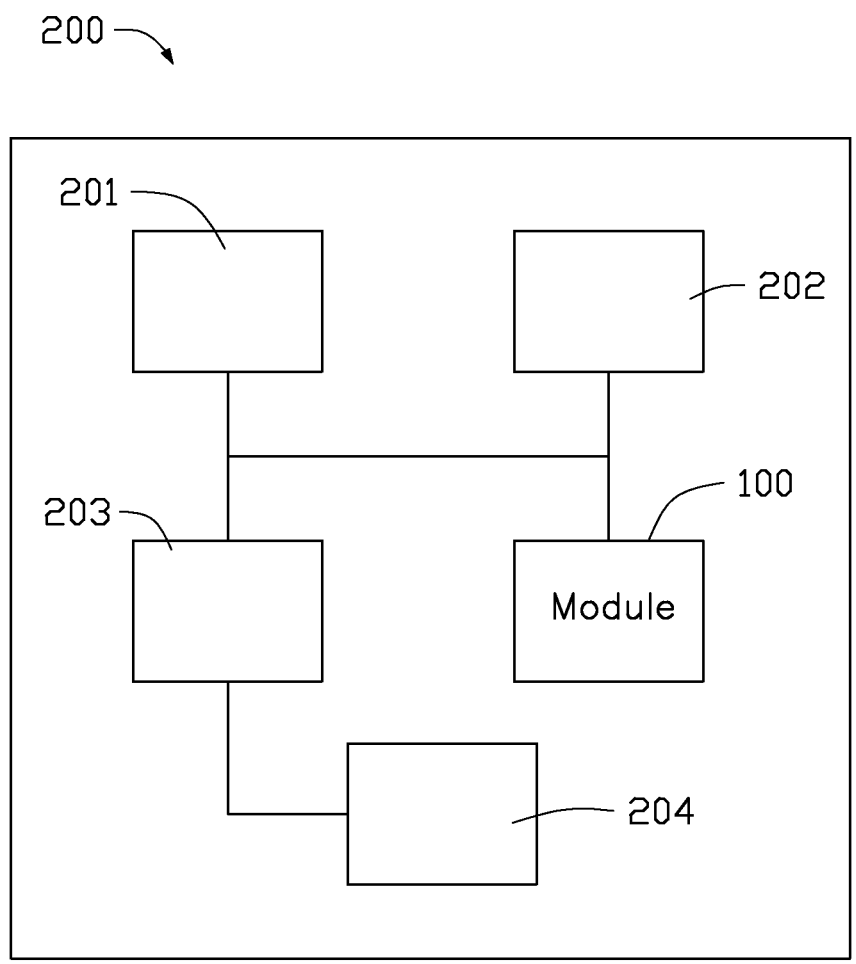
FIG. 10 shows a block diagram of a system using the photosensing device of FIG. 1A or 2A.

FIGS. 1A and 1B shows an embodiment of a photosensing device 1. The photosensing device 1 comprises multiple active pixel regions 30. The multiple active pixel regions 30 are shown as a matrix of rows and columns, however, in one embodiment, the matrix of rows and columns can be one row or one column. In another embodiment, as shown in FIG. 9, the photosensing device 1 are connected to at least one decoder, including row decoder circuits 101, and column decoder circuits 102, and multiplexer circuits 103 as a module 100 to extract the information from each active pixel region 30. In a further embodiment, as shown in FIG. 10, the module 100 is part of a system 200 where the extracted information from each active pixel region 30 is processed and/or displayed on a display screen 201 and/or stored in a storage unit 202 of the system, the system 200 may further comprises a controller 203 and/or an input module 204.

Each active pixel region 30 includes photodiodes 25 and a transistor. In this embodiment, the transistor may be a MOS transistor, such as a CMOS sensing circuit 35. Each photodiode 25 comprises a graphene layer 10 and a semiconductor layer 15. In this embodiment, the semiconductor layer 15 is a silicon-based layer, which may be but not limited to high opacity polycrystalline silicon or amorphous silicon. The CMOS sensing circuit 35 is an illustration of a CMOS sensing circuit, other variation of CMOS sensing circuitry may also be adopted. The CMOS sensing circuit 35 includes metal layers (e.g., M1, M2, etc.) separated by inter-metal dielectrics (e.g., IMD1, IMD2, etc.) and interconnected by vias 28. The CMOS sensing circuit also includes a silicon substrate, a P-well and an N-well on top of the Si substrate and transistors circuitry disposed on the P and N-well.

Figure 2A:
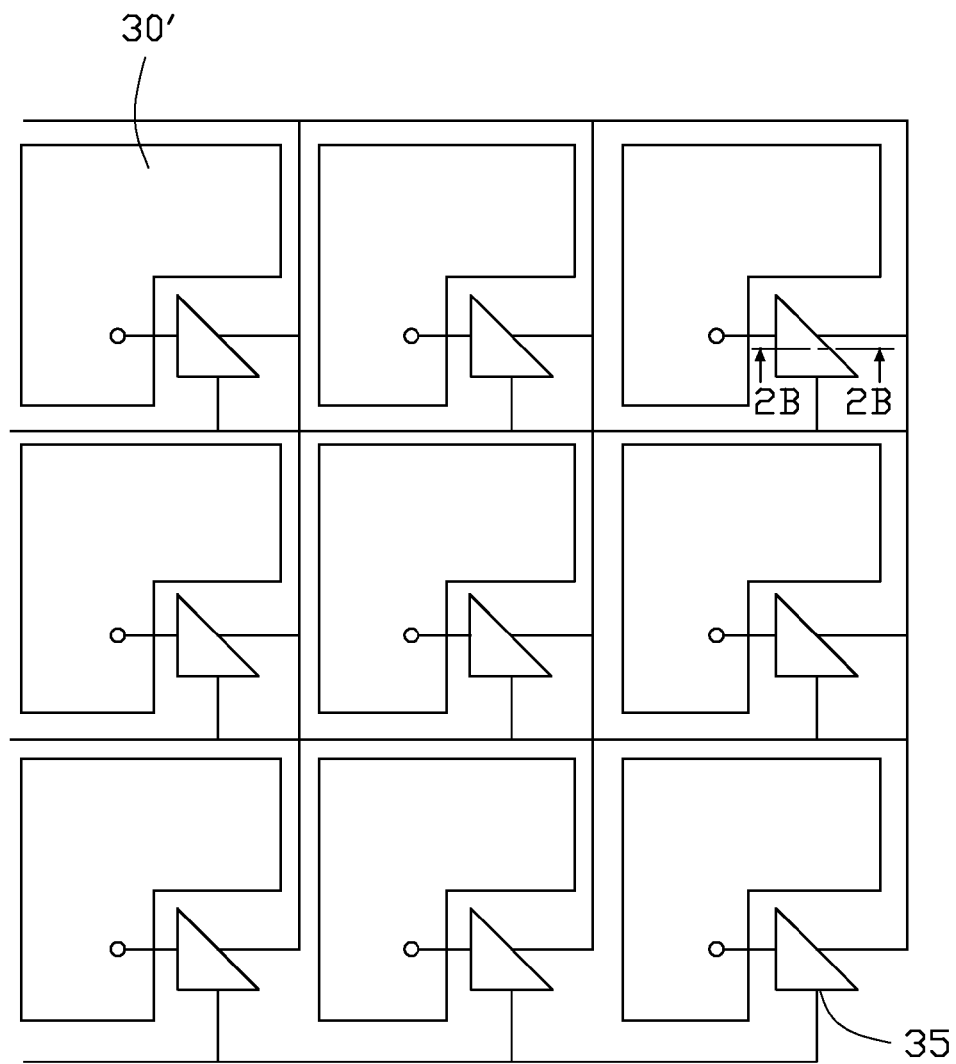
FIG. 2A is a perspective view of an array of photosensing devices in accordance with a second embodiment.
Figure 2B:
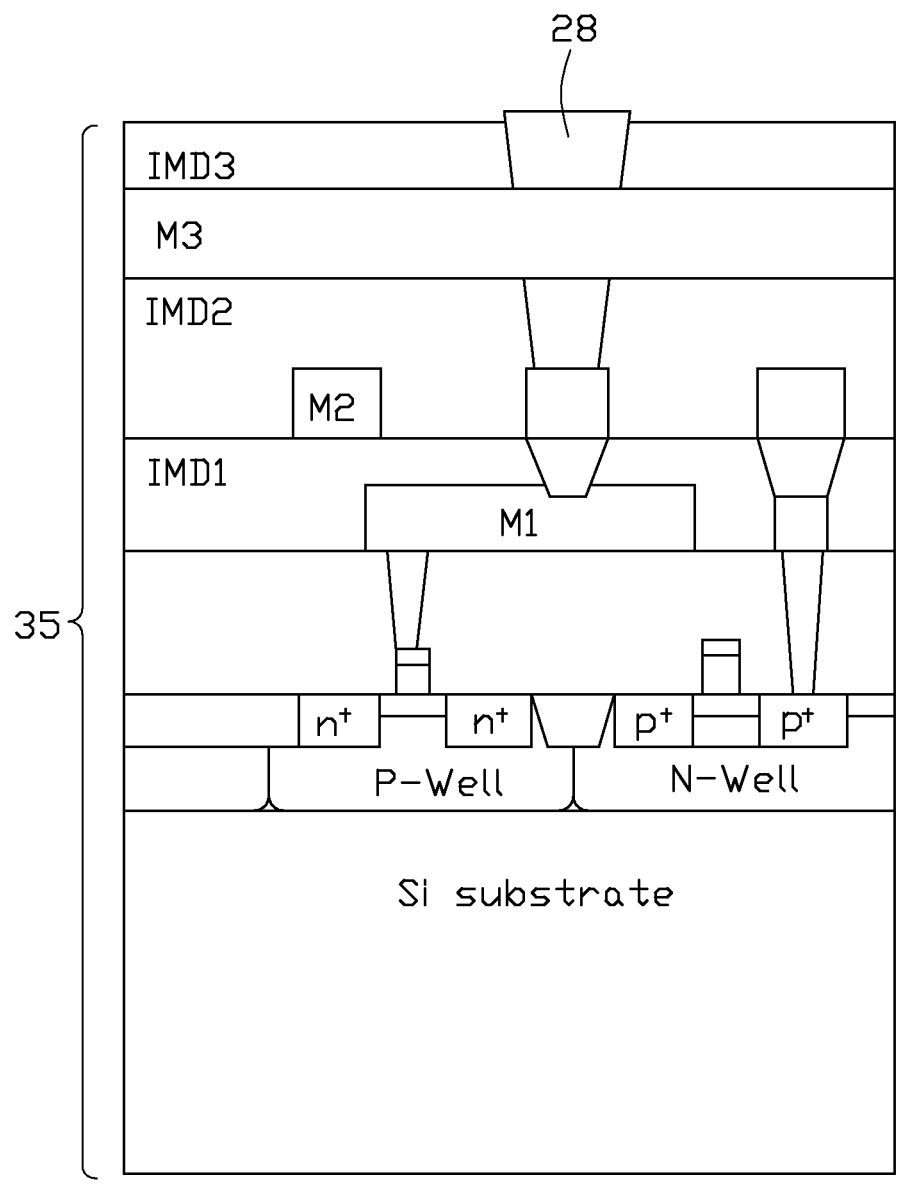
FIG. 2B is a cross-sectional view taken along line 2B-2B in FIG. 2A.

In FIGS. 1A and 1B, the graphene-semiconductor photodiode 25 is on top of the CMOS sensing circuit 35. In FIGS. 2A and 2B, the graphene-semiconductor photodiode 30' is adjacent to the CMOS sensing circuit 35.

The graphene layer 10 and the semiconductor layer 15 forms a graphene-semiconductor heterojunction. The semiconductor layer can be an n-type or a p-type semiconductor. In this embodiment, the semiconductor layer is of n-type conductivity. For graphene-semiconductor junction, the excitation of electrons by light energy occurs in the semiconductor, for example an n-type silicon, and the graphene is the carrier collector. The semiconductor layer 15 is a silicon-based layer, which may be but is not limited to high opacity polycrystalline silicon or amorphous silicon. As shown in FIG. 1B, the graphene-semiconductor photodiode 25 is implemented on the CMOS sensing circuit 35, the thickness of semiconductor layer 15 may be varied to allow only a certain range of wavelength band (e.g. visible light) to be absorbed. In conjunction with the low optical absorption (~2.3%) of graphene over a wide range of wavelength, infrared (IR) light may not be absorbed by the heterojunction, allowing only the light of certain wavelengths (e.g. visible light) to pass through, and the need for IR-cut filters, which are necessary in conventional CMOS image sensor modules, is eliminated while ensuring high amount of visible light is absorbed for photoexcitation.

CMOS image sensors, such as active pixel imaging sensors (APS), demand high pixel density (image resolution) in order to suit a wide variety of applications and consumers' needs. These CMOS image sensors can be applied to portable electronic devices such as cameras and cell phones.

The size of the sensor and the pixel density (i.e. image resolution) are interrelated and may directly affect the total photo-sensing area and the corresponding sensor performances including signal-to-noise ratio and operational dynamic range. For example, a CMOS image sensor with a higher pixel density (the sensor size being constant) may lead to smaller pixel size with reduced photo-sensing area and requires higher total amount of transistors in a chip, which effectively reduce the total photo-sensing area and thereby reduce photo responsivity and corresponding dynamic range.

By implementing graphene-semiconductor heterojunction on top of the CMOS IC chip, where high photo-responsivity at low light levels, low optical absorption, intrinsic signal suppression mechanism, high operational dynamic range, elimination of fill factor limits, reduced photodiode area, and straightforward implementation of the graphene-semiconductor heterojunction on semiconductor substrates may be realized, the aforementioned detrimental effects can be eliminated while maintaining the performance of CMOS image sensor.

Further, having the graphene-semiconductor heterojunction on the CMOS IC chip eliminates the limit of fill factor because the photodiode is not located in the same plane with the CMOS circuits. As shown in FIG. 1A, the photodiode locates above the circuits, on the CMOS IC chip, and do not have to share area with each other. Furthermore, with the photovoltage sensing mechanism, the area of photodiode needs not to be large, thus breaking the conventional resolution-sensor size tradeoff for CMOS image sensors. Also, as explained below, sensing the photovoltage, the circuit for each pixel becomes simplified since many circuit blocks such as reset circuit are not necessary.

Figure 3A:
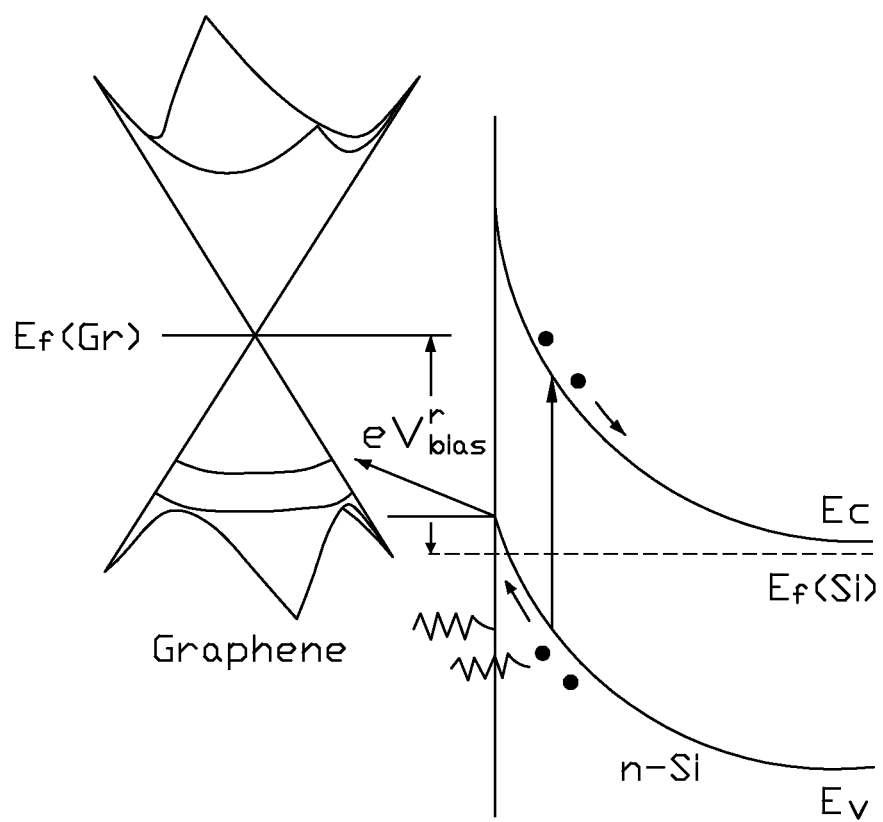
FIG. 3A shows biasing of a graphene-semiconductor heterojunction.

As shown in FIG. 3A, when a reverse bias (Vrbias) is applied to the graphene-semiconductor junction, the Fermi level of graphene (Ef(Gr)) moves higher with respect to the Fermi level of the n-type semiconductor (Ef(Si)). This feature allows for a greater number of accessible states for the photoexcited holes from the valence band of the semiconductor. Under low lighting condition where less photo-excited carriers are available due to limited amount of incident photons, these carriers may be collected more efficiently. Because of the low density of state property near the Fermi level of graphene (Ef(Gr)), the electric potential of graphene is highly sensitive to the amount of charges. Thus sensing the photovoltage of the graphene-semiconductor photodiode instead of the photocurrent, the photo-sensitivity of the photodiode becomes much greater than conventional photodiodes.

Figure 3B:
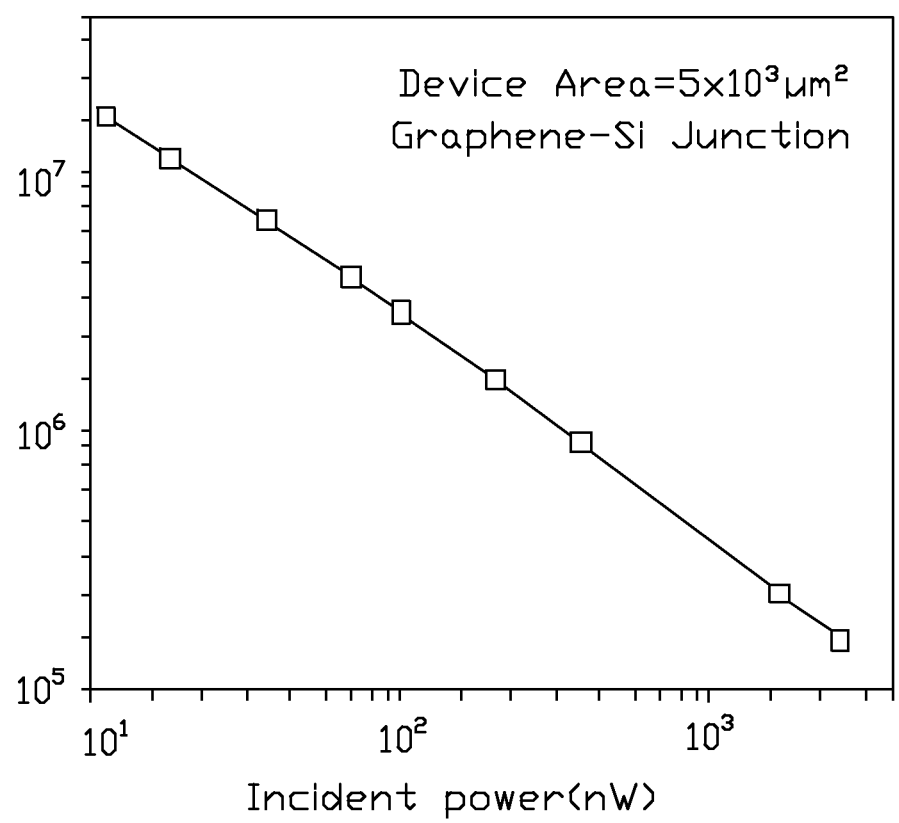
FIG. 3B shows a graph of photovoltage responsivity vs. incident power of a graphene-semiconductor heterojunction.
Figure 4:
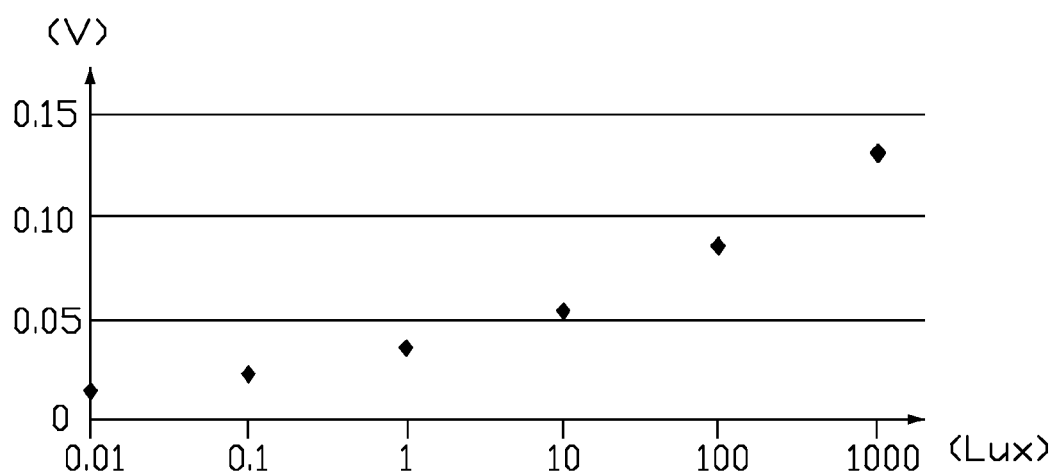
FIG. 4 is a graph showing photovoltage vs. illuminance of a graphene-semiconductor heterojunction.
Figure 5:
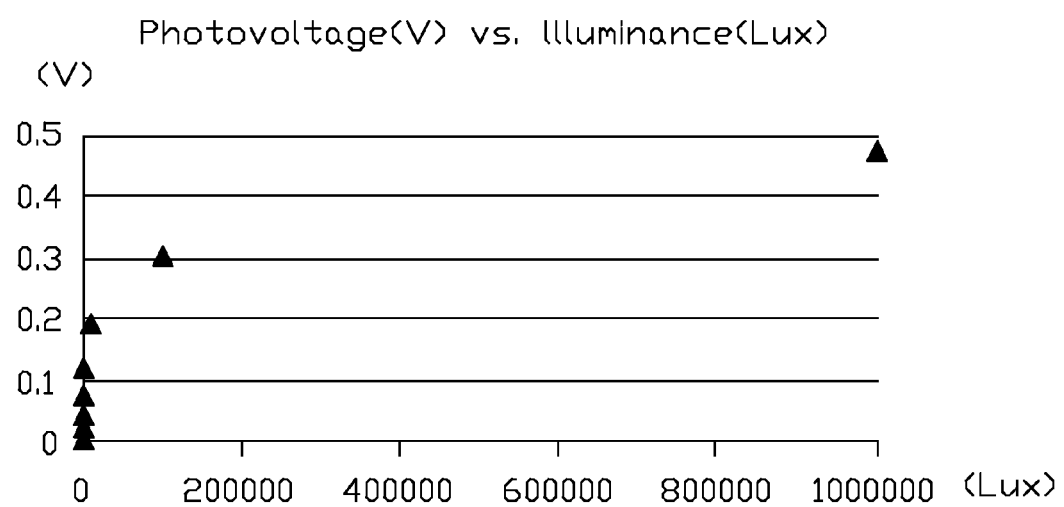
FIG. 5 is a graph showing photovoltage vs. illuminance of a graphene-semiconductor heterojunction.

By observing the open-circuit voltage, it is found that graphene-semiconductor photodiode is highly sensitive to incident light power. As shown in FIG. 3B, the photovoltage responsivity of the graphene-semiconductor heterojunction increases with decreasing incident light power. This inversely proportional correlation provides an intrinsic signal suppression mechanism, that is, the photovoltage (V) increases logarithmically with increasing illuminance (lux) (see FIGS. 4 and 5). Thus, the graphene-semiconductor heterojunction photodiode absorbs more photons (e.g. higher illuminance under direct sunlight) than conventional photodiodes. This achieves a higher operational dynamic range as image sensor without employing conventional signal suppression techniques, which either require more transistors in each pixel to mimic the logarithmic relation or need to implement complex control circuits to separately deal with the signals at low and high illumination levels.

Figure 6A:
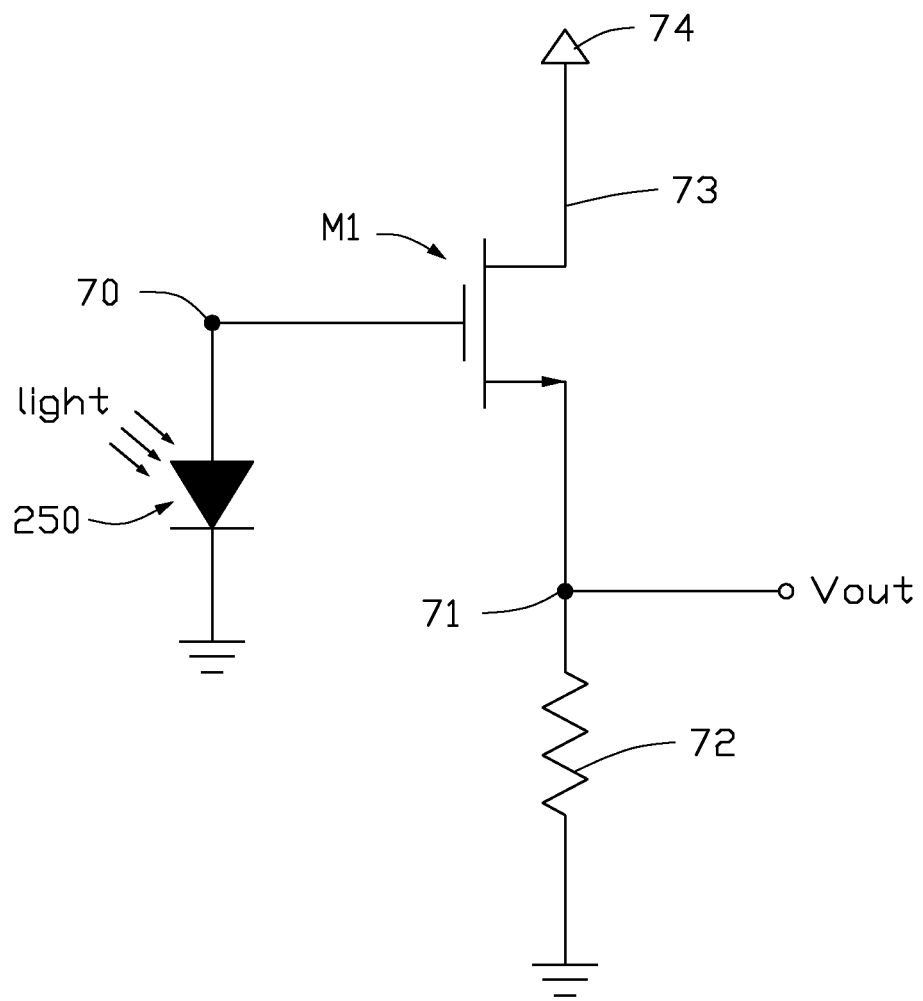
FIGS. 6A and 6B are schematic diagrams showing the sensing of the photovoltage of the photodiodes in FIGS. 1A and 1B.
Figure 6B:
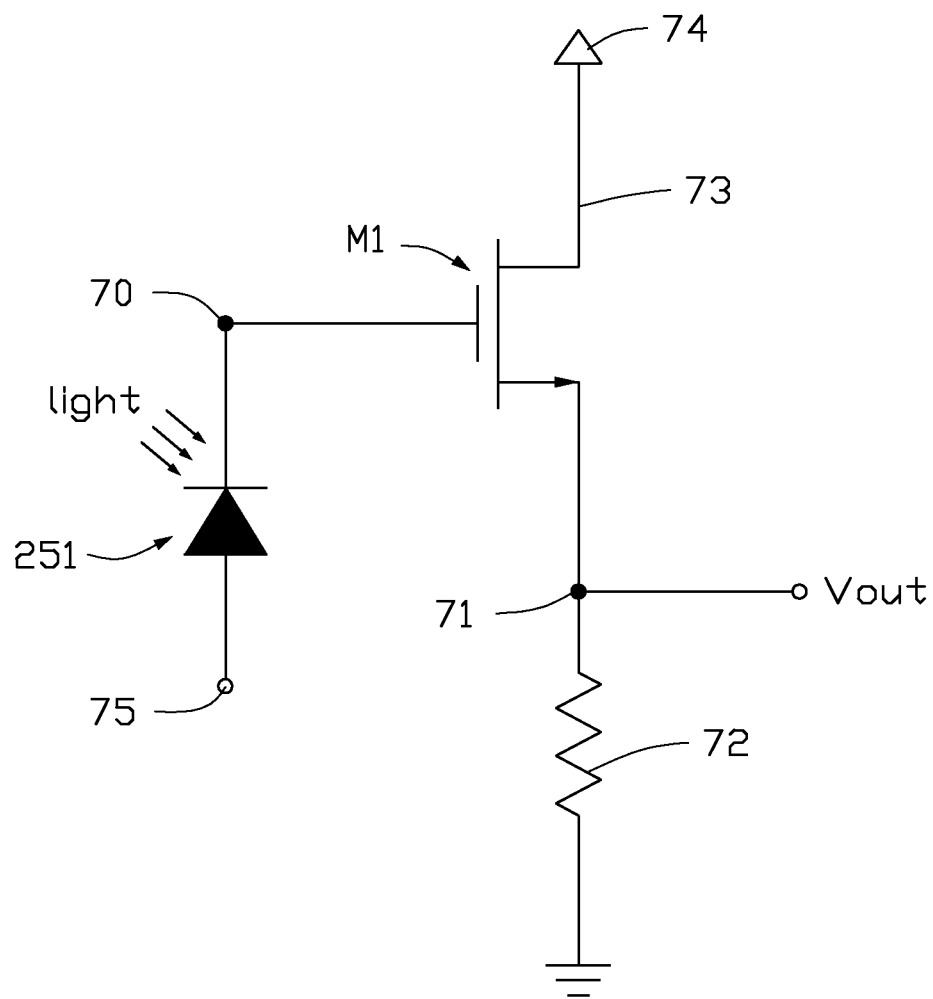

FIGS. 6A and 6B show schematic diagrams of one way of sensing a photovoltage of a graphene-semiconductor photodiode. As illustrated in FIGS. 6A and 6B, the first or the second terminal of the graphene-semiconductor diode can be connected to a reference voltage source. In the embodiments of FIGS. 6A and 6B, the reference voltage source is ground and a constant voltage source respectively. In FIG. 6A, the graphene-semiconductor photodiode 250, wherein the semiconductor is of n-type conductivity, is connected to a transistor, such as a MOSFET M1 in a source follower configuration. The graphene terminal is an anode, and is connected to the gate 70 of the MOSFET M1 and the semiconductor terminal is a cathode, and is connected to ground. The source 71 of the MOSFET is grounded through resistor 72 and the drain 73 is connected to voltage Vdd 74. The output Vout is taken at the source 71 of the MOSFET M1. In FIG. 6B, the graphene-semiconductor photodiode 251, wherein the semiconductor is of p-type conductivity, is connected to a transistor, such as a MOSFET M1 in a source follower configuration. The graphene terminal is a cathode, and is connected to the gate 70 of the MOSFET M1 and the semiconductor terminal is an anode, and is connected to a constant voltage source Vconst 75. The source 71 of the MOSFET is grounded through resistor 72 and the drain 73 is connected to voltage Vdd 74. The output Vout is taken at the source 71 of the MOSFET M1.

Figure 7A:
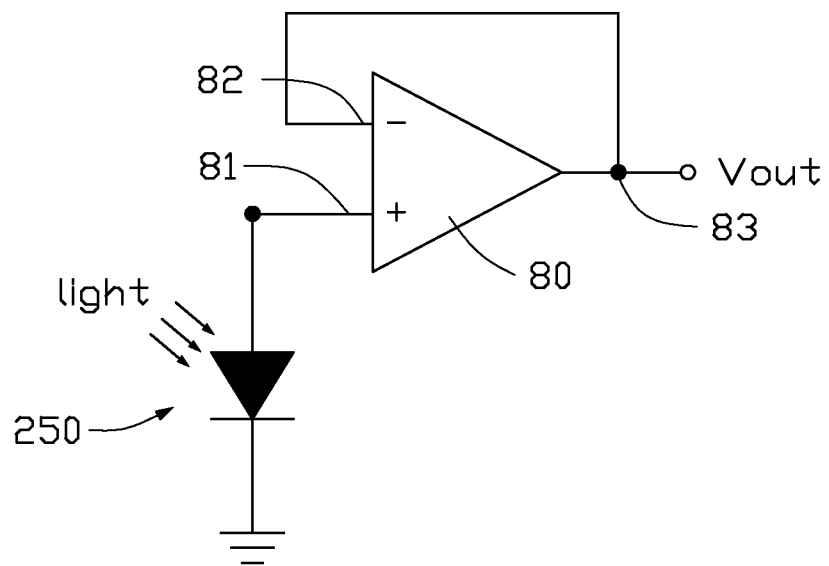
FIGS. 7A and 7B are schematic diagrams showing the sensing of the photovoltage of the photodiodes in FIGS. 1A and 1B.
Figure 7B:
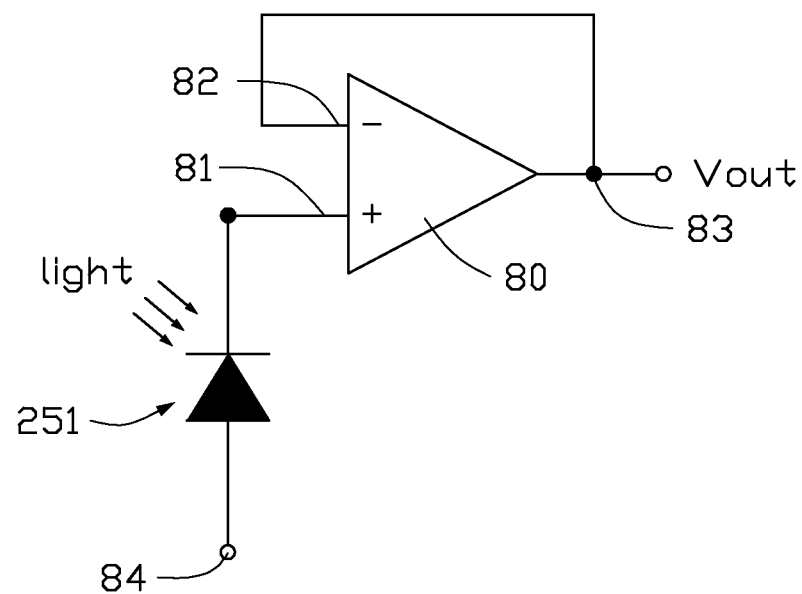

FIGS. 7A and 7B show schematic diagrams of another way of sensing a photovoltage of a graphene-semiconductor photodiode. As illustrated in FIGS. 7A and 7B, the first or the second terminal of the graphene-semiconductor diode can be connected to a reference voltage source. In the embodiments of FIGS. 7A and 7B, the reference voltage source is ground and a constant voltage source respectively. In FIG. 7A, the graphene-semiconductor photodiode 250 is connected to an operational amplifier (op-amp) 80 in a voltage buffer configuration. The input transistors of the op-amp may be transistors, such as MOSFETs. The graphene terminal of the photodiode 250 is an anode, and is connected to the non-inverting input terminal 81 of the op-amp, and the semiconductor terminal is a cathode, and is connected to ground. The inverting input 82 of the op-amp is connected to the output 83 of the op-amp. In FIG. 7B, the graphene-semiconductor photodiode 251 is connected to an operational amplifier (op-amp) 80 in a voltage buffer configuration. The input transistors of the op-amp may be transistors, such as MOSFETs. The graphene terminal of the photodiode 251 is an cathode, and is connected to the non-inverting input terminal 81 of the op-amp, and the semiconductor terminal is an anode, and is connected to constant voltage source Vconst 84. The inverting input 82 of the op-amp is connected to the output 83 of the op-amp.

Because negligible or no current flows to the gate 70 of the MOSFET M1 or into the non-inverting input terminal 81 of the op-amp, the photovoltage at the graphene terminal of the graphene-semiconductor photodiode 250 or the photovoltage at the graphene terminal of the graphene-semiconductor photodiode 251 is sensed by MOSFET M1 or the op-amp 80. Because the photovoltage, not the photocurrent is being sensed, reset transistor may not be needed because the photosensing device is capable of accepting higher intensity of light before saturation occurs.

Figure 8:
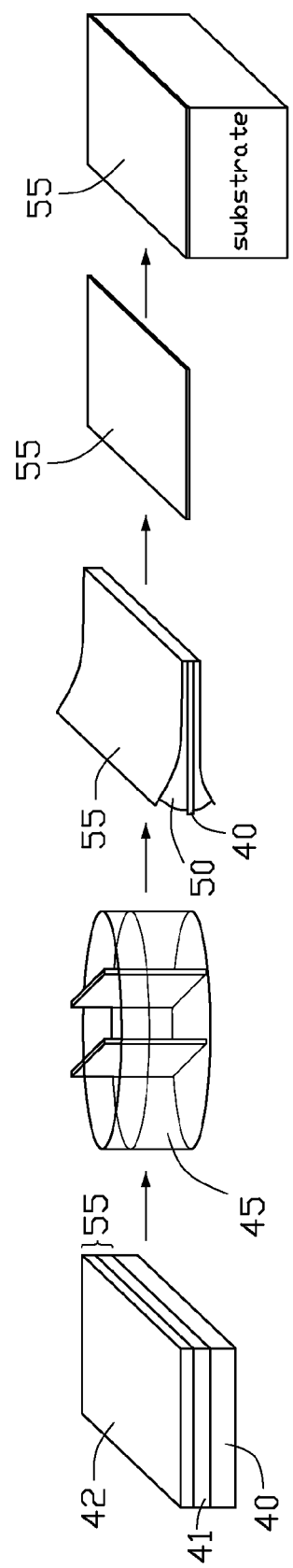
FIG. 8 shows the process of manufacturing of graphene-sensing heterojunction of a graphene-semiconductor heterojunction.

The graphene may be disposed on a substrate by techniques including but not limited to: chemical vapor deposition (CVD) and graphene transfer. In CVD, the chemical vapors of material elements interact and then deposit on the surface of wafer. In the case of CMOS image sensor, since the metal layers already on the CMOS IC chip cannot endure high temperature, the graphene may be deposited by using low-temperature processes. Therefore, the CVD processes for growing graphene in this embodiment may be the ones with low growth temperature but assisted by ionized gasses, such as plasma-enhanced CVD (PECVD) or electron-cyclotron resonance CVD (ECRCVD). In graphene transfer, as shown in FIG. 8, the graphene 41 is first grown on a copper foil 40 by CVD. Then the foil is coated with polymethyl methacrylate (PMMA) 42. The graphene along with the PMMA layer 42 is separated from the Cu foil 40 by H2 bubbles 50 using the so-called H2 bubbling process in a NaOH solution 45 or by directly etching away the copper foil 40 in a FeCl3 solution. The graphene-PMMA 55 is then placed onto the substrate. The graphene adheres to the substrate due to Van der Waals force. The PMMA can then be washed away by normal chemical etching.

The graphene-semiconductor heterojunction is created by disposing semiconductor material on top of the previously grown graphene by sputtering, bonding another substrate (on which the semiconductor layer already exists, to the surface of graphene), or chemical vapor deposition (in the case of CMOS image sensor implementation, a CMOS post process compatible CVD, such as PECVD or ECRCVD, may be used).

In another embodiment, the graphene-semiconductor heterojunction may be implemented on various semiconductor substrates (such as Si, GaAs, or other semiconductors) as discrete photodetectors for applications such as ambient light sensor, range finder, or proximity sensor.

In another embodiment of the present disclosure, the graphene-semiconductor heterojunction may be implemented on large substrates (such as glass or plastic) as image sensors. The thickness of the glass may vary to provide different application needs, such as a thin glass with certain flexibility. The plastic may be PEN (polyethylene naphthalate), PES (polyethersulfone), PET (polyester), PI (polyimide) and so forth. In the case of adopting plastic as substrates, low temperature manufacturing processes are preferred, such as transfer, coating, sputtering, low-temperature CVD and so forth). These image sensors may be applied to larger camera for 3C (such as on large screen), large camera for surveillance, vehicles, defense (such as on windows or mirrors), large camera for medical imaging.

In a further embodiment, the graphene-semiconductor heterojunction may be implemented as X-ray image sensor, wherein the graphene is disposed by CVD or graphene transfer process on crystalline silicon substrate or amorphous silicon on glass substrate after the pixel circuit has been processed. The graphene may also be disposed on flexible plastic substrate, with low temperature manufacturing processes, such as transfer, coating, sputtering, low-temperature CVD and so forth. Reflective material such as aluminum may be disposed on top of the graphene layer, wherein a plurality of scintillators such as CsI:Tl may be enclosed within the reflective material. The graphene is covered and protected by scintillators. The reflective material allows X-ray to pass through and reflects the visible light emitted from scintillator. With the aforementioned higher sensitivity of graphene-semiconductor photodetectors, the dose of X-ray may be reduced, thus lowering the radiation exposure to patients.

The described embodiments are merely possible examples of implementations, set forth for a clear understanding of the principles of the present disclosure. Many variations and modifications may be made without departing substantially from the spirit and principles of the present disclosure. All such modifications and variations are intended to be comprised herein within the scope of this disclosure and the described inventive embodiments, and the present disclosure is protected by the following claims.

What is claimed is:

1. A photosensing device, comprising:
   a substrate comprising a plurality of integrally formed photovoltage sensing mechanisms; and
   a plurality of graphene-semiconductor heterojunctions configured to connect with a gate of a field-effect transistor for providing photovoltage, wherein each graphene-semiconductor heterojunction comprises:
   a graphene layer; and
   a semiconductor layer; wherein, the graphene layer is positioned on top of the substrate, and the semiconductor layer is positioned on top of the graphene layer; and
   wherein each of the plurality of photovoltage sensing mechanisms is coupled to the corresponding one of the plurality of the graphene-semiconductor heterojunctions.

2. The photosensing device of claim 1, wherein the plurality of graphene-semiconductor heterojunctions is arranged in a one dimensional array.

3. The photosensing device of claim 1, wherein the plurality of graphene-semiconductor heterojunctions is arranged in a two dimensional array.

4. The photosensing device of claim 1, wherein the semiconductor layer is a silicon layer.

5. The photosensing device of claim 1, wherein the graphene layer is positioned by chemical vapor deposition or graphene transfer.

6. The photosensing device of claim 4, wherein the silicon layer is a polycrystalline silicon layer.

7. The photosensing device of claim 4, wherein the silicon layer is an amorphous silicon layer.

8. A photosensing device, comprising:
   a substrate comprising a plurality of integrally formed photovoltage sensing mechanisms; and
   a plurality of graphene-semiconductor photosensing heterojunctions configured to connect with a gate of a field-effect transistor for providing photovoltage, wherein each graphene-semiconductor heterojunction comprises:
   a graphene layer; and
   a semiconductor layer;
   wherein the graphene layer covers a portion of the substrate and the semiconductor layer covers the graphene layer; and
   wherein each of the plurality of photovoltage sensing mechanisms is coupled to the corresponding one of the plurality of graphene-semiconductor heterojunctions.

9. The photosensing device of claim 8, wherein the plurality of graphene-semiconductor photosensing heterojunctions is arranged in a one dimension array.

10. The photosensing device of claim 8, wherein the plurality of graphene-semiconductor photosensing heterojunctions is arranged in a two dimensional array.

11. The photosensing device of claim 8, wherein the semiconductor layer is a silicon layer.

12. The photosensing device of claim 8, wherein the graphene layer is positioned by chemical vapor deposition or graphene transfer.

13. The photosensing device of claim 11, wherein the silicon layer is a polycrystalline silicon layer.

14. The photosensing device of claim 11, wherein the silicon layer is an amorphous silicon layer.

15. A photosensing module, comprising:
at least one decoder; and
at least one photosensing device, comprising:
a substrate comprising a plurality of integrally formed photovoltage sensing mechanisms; and
a plurality of graphene-semiconductor photosensing heterojunctions configured to connect with a gate of a field-effect transistor for providing photovoltage, wherein each graphene-semiconductor heterojunction comprises:
a graphene layer; and
a semiconducting layer;
wherein the graphene layer is positioned on top of the substrate and the semiconductor layer is positioned on top of the graphene layer; and
wherein each of the plurality of photovoltage sensing mechanisms is coupled to the corresponding one of the plurality of the graphene-semiconductor heterojunction.

* * * * *